United States Patent [19]

Yassa et al.

[11] Patent Number: 4,862,098

[45] Date of Patent: Aug. 29, 1989

[54] CONTINUOUS-WAVE-MODULATION DETECTORS USING PREDICTION METHODS

[75] Inventors: Fatby F. Yassa, Clifton Park; Barbara A. Thompson, Ballston Spa, both of N.Y.

[73] Assignee: General Electric Company, Schenectady, N.Y.

[21] Appl. No.: 316,822

[22] Filed: Feb. 28, 1989

Related U.S. Application Data

[63] Continuation-in-part of Ser. No. 190,191, May 4, 1988, abandoned, and a continuation-in-part of Ser. No. 194,257, May 16, 1988, abandoned.

[51] Int. Cl.[4] ............................................. H03D 3/18
[52] U.S. Cl. ................................... 329/50; 329/122; 329/168
[58] Field of Search ................ 329/50, 122, 168, 169; 375/41, 77, 80, 99, 102; 455/202, 214, 296, 312, 337; 331/12

[56] References Cited

U.S. PATENT DOCUMENTS

| 4,403,194 | 9/1983 | Talbot | 329/146 |
| 4,495,475 | 1/1985 | Mark et al. | 331/12 |
| 4,731,844 | 3/1988 | Christopher | 381/13 |

OTHER PUBLICATIONS

Daniel Denaro et al., "The Easy Way to Interface an LVDT to Digital", Analogue Dialogue, 20-2, 1986, pp. 19-21.
L. M. DeVito, "A 10 ppm Resolution Interface Circuit for a Position Transducer", 1988, IEEE International Solid State Circuits Conf, Feb. 18, 1988, pp. 194-195.
"LVDT to Digital Converter", catalog published by Analog Devices, Norwood, Mass., circa 1986.
"HSD/HRD 1024 Improved, Second Generation Synchro(Resolver)-to-Digital Converter Microprocessor Compatible 14-bit Hybrid", catalog by Natel Eng. Co., Inc., Simi Valley, Calif., 1986.
S. Haykin, Communications Systems, 2nd edition, John Wiley & Sons, 1983, pp. 125-135.
"Adaptive Noise Cancelling: Principles & Applications", B. Widrow et al., Proceedings of the IEEE, vol. 63, No. 12, pp. 1692-1716, Dec. 1975.
"Stationary and Non-Stationary Learning Characteristics of the LMS Adaptive Filter", B. Widrow et al., Proceedings of the IEEE, vol. 64, No. 8, pp. 1151-1162, Aug. 1976.

*Primary Examiner*—Eugene R. Laroche
*Assistant Examiner*—Robert J. Pascal
*Attorney, Agent, or Firm*—Allen L. Limberg; James C. Davis, Jr.; Marvin Snyder

[57] ABSTRACT

A detector for a first continuous-wave-modulation signal is supplied an unmodulated carrier signal in addition to the first continuous-wave-modulation signal. Means are provided for modulating the unmodulated carrier signal responsive to output signal from the detector to generate a second continuous-wave-modulation signal encoding a previous value of output signal, as delayed to provide a predicted input signal, in the same way the first continuous-wave-modulation signal encodes the input signal. The first and second continuous-wave-modulation signals are linearly combined so as to cancel the correlated portions of them and to develop a third continuous-wave-modulation signal with suppressed carrier, which is detected to recover an error signal. This error signal is combined with the predicted input signal obtained by delaying a previous value of said output signal, thereby to generate the current output signal of the detector. The continuous-wave-modulation can be amplitude-modulation, pulse-amplitude-modulation, narrowband phase-modulation, narrowband frequency-modulation or narrowband combined-frequency-and-phase-modulation, by way of example.

50 Claims, 8 Drawing Sheets

CONTINUOUS-WAVE-MODULATION DETECTORS USING PREDICTION METHODS

This is a continuation-in-part of U.S. patent application Ser. No. 190,191 filed 4 May 1988 and of U.S. patent application Ser. No. 194,257 filed 16 May 1988, both now abandoned.

The invention relates to continuous-wave-modulation detectors and, more particularly, to such detectors using prediction methods.

BACKGROUND OF THE INVENTION

Continuous-wave-modulation signals have a modulating function that is continuous in nature. If a modulating function that exhibits discontinuities, such as a chain of pulses, is subjected to band-limiting filtering to reduce the rate-of-change or "slew rate" in the filter response, the filter response can constitute continuous-wave-modulation insofar as used with a detector constructed in accordance with the invention. The actual form of modulation used in the input signal for such a detector can take a number of forms. Among the well-known ones are amplitude-modulation (AM), pulse-amplitude-modulation (PAM), phase-modulation (PM), frequency-modulation (FM), and combined phase-and frequency-modulation as employed, for example, in mobile communications.

A desire in an amplitude-modulation detector is to decode the input signal encoded in the amplitude-modulation signal as free as possible from unwanted residues of carrier, carrier harmonics and sidebands thereof. This is the case in detectors handling digital sampled data, since low-pass or band-reject filtering to suppress these residues is cumbersome if their amplitudes are not substantially smaller than the decoded input signal. This is also the case for AM detectors handling analog signals, since the filters often require inductors or resistor-capacitor-amplifier filter elements that are of substantial physical size. Conventional balanced AM detector designs which cancel carrier fundamental and odd harmonics are helpful. However, the even carrier harmonics and their sidebands which remain as residues of the balanced detection process are appreciably large, since their combined amplitudes are a substantial fraction of the amplitude of the amplitude-modulation signal being detected. The suppression of these residues, while at the same time avoiding baseband roll-off of the higher frequencies of the recovered modulating signal, requires low-pass filtering of considerable complexity, which filtering it is desired to avoid.

F. F. Yassa in his patent applications serial numbers 190,191 and 194,257 described analog and digital species of a new type of amplitude-modulation detector using a prediction method to recover a baseband output signal free of baseband roll-off and also relatively free of carrier harmonics and their sidebands. The detector is supplied a first amplitude-modulation signal, which describes an input signal, and an unmodulated carrier signal, which is the same frequency as a carrier used in the generation of said first amplitude-modulation signal. The unmodulated carrier signal is amplitude-modulated with a predicted input signal, thereby to generate a second amplitude-modulation signal. The first and second amplitude-modulation signals are linearly combined so as to cancel the correlated portions of them and thereby develop a suppressed-carrier third amplitude-modulation signal. The third amplitude-modulation signal is synchronously demodulated with the unmodulated carrier signal, thereby to generate an error signal. The error signal is combined with the predicted input signal to recover an output signal. The predicted input signal is continuously revised based on the current output signal and is preferably generated by delaying the output signal slightly in time.

As pointed out by F. F. Yassa in his patent application serial number 194,257, an amplitude-modulation detector of this general type is especially attractive for handling digitized amplitude-modulation signals, because complex digital filtering of the output signals is unnecessary. This is because the amplitude of the carrier harmonics and their sidebands in the output signal are a substantial fraction of the amplitude of the relatively small suppressed-carrier third amplitude-modulation signal only, rather than a substantial fraction of the amplitude of the relatively large first amplitude-modulation signal as in prior-art amplitude-modulation detectors. Furthermore, as pointed out by F. F. Yassa in his patent application serial number 190,191, an amplitude-modulation detector of the general type is attractive for handling analog amplitude-modulation signals, particularly in instances where the carrier is not far above baseband, since the need for multi-section filtering to obtain baseband signals free of phase-distortion and carrier residues is avoided.

Another new type of continuous-wave modulation detector, described for the first time herein, permits both the recovery of information encoded in in-phase sidebands of the carrier and the recovery of information encoded in quadrature-phase sidebands of the carrier, which carrier may be partially or fully suppressed. The information is recovered substantially free of residues of carrier, carrier harmonics and sidebands thereof. An input signal has a real portion, which is encoded in amplitude-modulation form in the in-phase sidebands of a carrier, and has an imaginary portion, which is encoded in amplitude-modulation form in the quadrature sidebands of the carrier. This first complex amplitude-modulation signal is supplied to the detector together with in-phase and quadrature components of a complex unmodulated carrier signal. Means are provided for amplitude-modulating the in-phase component of the complex unmodulated carrier signal with the real component of a complex predicted input signal, and means are provided for amplitude-modulating the quadrature component of the complex unmodulated carrier signal with the imaginary component of the complex predicted input signal. The resulting orthogonal amplitude-modulation sidebands are linearly combined to generate a second complex amplitude-modulation signal. The first and second complex amplitude-modulation signals are linearly combined so as to cancel the correlated portions of them and to develop a suppressed-carrier third complex amplitude-modulation signal descriptive of their lack of correlation. This third complex amplitude-modulation signal is synchronously demodulated with the in-phase and quadrature components of the complex unmodulated carrier to detect the real and the imaginary components of a complex error signal. The real components of the complex error signal and of the complex predicted input signal are combined to recover the real component of a complex output signal, from which the real component of the predicted input signal is derived. The imaginary components of the complex error signal and of the complex predicted input signal are combined to recover the imaginary component of the complex output signal, from which the imaginary component of the predicted input signal is derived.

The complex-modulation detector described in the previous paragraph can also be used to detect angle-modulation of a carrier wave for sufficiently low indices of modulation.

SUMMARY OF THE INVENTION

A detector for a first continuous-wave-modulation signal is supplied an unmodulated carrier signal in addition to the first continuous-wave-modulation signal. Means are provided for modulating the unmodulated carrier signal responsive to output signal from the detector to generate a second continuous-wave-modulation signal encoding a previous value of output signal, as delayed to provide a predicted input signal, in the same way the first continuous-wave-modulation signal encodes the input signal. The first and second continuous-wave-modulation signals are linearly combined so as to cancel the correlated portions of them and to develop a third continuous-wave-modulation signal with suppressed carrier, which is detected to recover an error signal. This error signal is combined with the predicted input signal obtained by delaying a previous value of said output signal, thereby to generate the current output signal of the detector.

DESCRIPTION OF THE PREFERRED EMBODIMENTS OF THE INVENTION

Figure 1:
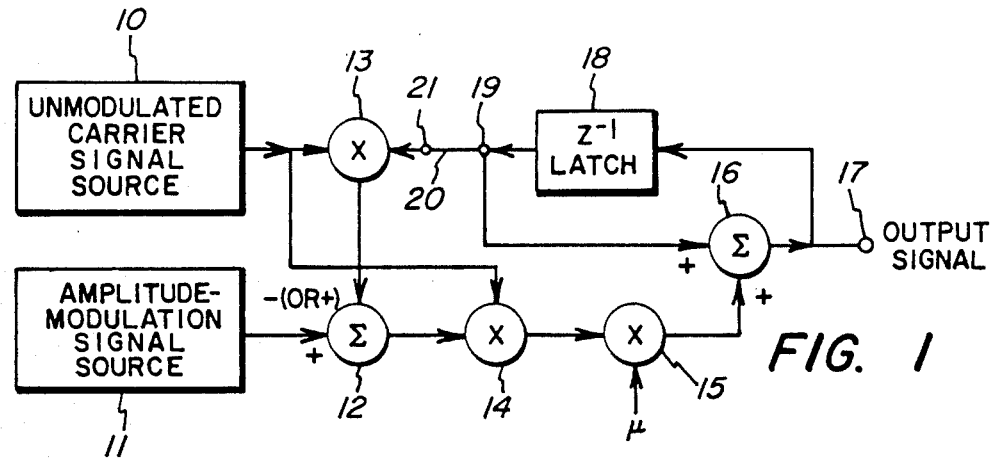
FIGS. 1 and 2 are each a schematic diagram of a detector for suppressed-carrier double-sideband amplitude-modulation (DSB AM) signal, each of which detectors embodies the present invention.

In FIG. 1 there is a source 10 of carrier signal which carrier signal in a digital system is supplied as digitized sample data occurring at a sample rate $R_s$ that is substantially higher than the carrier signal frequency. There is also a source 11 of a double-sideband, suppressed-carrier first amplitude-modulation signal supplied as digitized sample data occurring at sample rate $R_s$. The amplitude modulation of the first AM signal encodes an input signal. The suppressed carrier of the first AM signal, were it not suppressed, would be of the same frequency as the unmodulated carrier signal and of the same or opposite phase as the unmodulated carrier signal. I.e., the double-sideband, suppressed-carrier first AM signal from source 11 is generated in the FIG. 1 embodiment of the invention using a carrier of the same frequency as the unmodulated carrier signal and in a correct phase relationship with the unmodulated carrier signal. The first AM signal is applied to an input port of a linear combiner 12, specifically the minuend input port when linear combiner 12 is operated as s subtractor, as is being presently described.

A four-quadrant digital multiplier 13 multiplies together a predicted input signal supplied to its multiplier input port and an unmodulated carrier signal supplied to its multiplicand input port from source 10. Multiplier 13 supplies as its product a double-sideband, suppressed-carrier second amplitude-modulation signal, which is applied to another input port of linear combiner 12, specifically the subtrahend input port of linear combiner 12 when operated as a subtractor as here described. Linear combiner 12 is a means for linearly combining the instantaneous amplitudes of the first and second AM signals so as to cancel correlated portions of them, which means produces a double-sideband, suppressed-carrier third amplitude-modulation signal at its difference output port.

This third AM signal is synchronously demodulated to generate an error signal indicative of how closely the predicted input signal matches the input signal encoded in the first AM signal. The synchronous demodulation is shown as being done by a four-quadrant digital multiplier 14, receptive of the unmodulated carrier signal and of the third AM signal at separate ones of its multiplier and multiplicand input ports, to produce the error signal at its product output port. (Other methods of doing the synchronous demodulation will readily occur to those skilled in the art. E.g., methods where the polarity of the unmodulated carrier signal is used to modify the polarity of the third AM signal, in order to generate the error signal, can avoid the need for a four-quadrant digital multiplier.)

The error signal from the product output port of multiplier 14 may be modified by multiplying it by a constant factor as shown in FIG. 1. Here a two-quadrant digit 1 multiplier 15 modifies the error signal by weighting it by a factor mu. The prescribed weight mu is chosen small enough to avoid undesirable self-oscillatory or near-oscillatory conditions in the supposedly-degenerative feedback loop comprising linear combiner 16, any delay introduced by circuitry 18 between linear combiner 16 and multiplier 13, multiplier 13, linear combiner 12, and multipliers 14 and 15.

Linear combiner 16 is operated as an adder to sum the predicted signal and the (modified) error signal supplied to its addend input ports. Linear combiner 16 supplies an output signal from its sum output port to an output terminal 17, which output signal approximates the input signal encoded in the first AM signal. Finally, the predicted input signal is generated by delaying the output signal for one sample period in a latch 18. The predicted input signal is shown as being supplied to an interface 19 and thence through a (multiple-wire) connection 20 to an interface 21 at the multiplier input port of digital multiplier 13. In general, connections between elements are multiple-wire, reflective of the samples transmitted over these connections having a multiplicity of bits.

The underlying principles of operation in the FIG. 1 AM signal detector are as follows. Successive samples of a frequency sampled AM signal exhibit a high degree of correlation. That is, if $R_s$ is appreciably higher than carrier frequency of the AM signal, then successive samples of the demodulated AM signal substantially correspond, though with a departure between them that is bounded by the modulation rate. This allows a prediction to be made of the next input signal value encoded in the first AM signal based on the previously decoded input signal value—i.e., based on the detector output signal. A predicted input signal predicted from the recent output signal is used to generate a second AM signal that approximates the first AM signal, which encodes current values of input signal. Comparing the first and second AM signals to find the error between them allows the predicted input signal to be corrected better to correspond to the input signal encoded in the first AM signal.

In certain preferred embodiments of the invention this comparison is made by subtracting the second AM signal from the first AM signal, thereby to obtain a suppressed-carrier third AM signal. Since this third AM signal encodes the error signal, and since the correlation between successive samples of input signal is presumed to be good, so error signal is small in value, the suppressed-carrier third AM signal is small in amplitude. Synchronous demodulation of this third AM signal can therefore be done to decode the error signal, so there is little attendant residue above baseband. Only this above-baseband residue (which comprises carrier harmonics and sidebands thereof) accompanies the baseband detector output from adder 16.

The FIG. 1 detector configuration is suited for use with relatively low carrier frequencies, where the sample rate $R_s$ can be chosen so low that successive digital multiplications in each of the multipliers 13, 14 and 15 can be completed within one sample period. At relatively high carrier frequencies, in order to satisfy the Nyquist Criterion, the sample rate $R_s$ has to be chosen so high that these multiplication steps and the linear combination step in adder 12 require i sample periods, where i is a positive integral number of sample periods.

Figure 2:
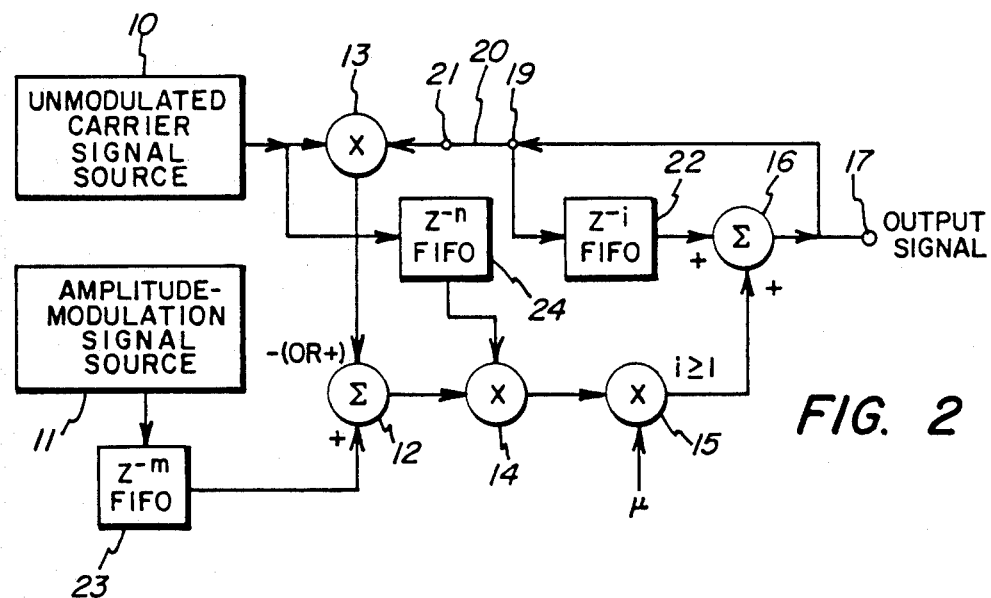

FIG. 2 shows a modification that can be made to the FIG. 1 detector to accommodate such relatively high carrier frequencies. The output signal is applied without further delay to interface 19, and thence to the multiplier input port of digital multiplier 13, the product from multiplier 13 being as if the predicted input signal were delayed a number of sample times from the output signal. The additional delay in elements 12, 14 and 15 augments this delay so the total delay through elements 13, 12, 14 and 15 is i sample periods. For this reason, the output signal is delayed i sample periods in a first-in/first-out (FIFO) buffer memory 22 before subsequent summation, as predicted input signal, with the error signal in adder 16.

Certain other delays have to be introduced to insure proper operation. The delays encountered in digital multiplier 13 and in adder 12 affect the unmodulated carrier multiplicand signal as well as the multiplier signal applied to interface 21. If the unmodulated carrier signal multiplicand signal is the same as the carrier in the amplitude-modulation signal source, the carrier at adder 12 input port will be undesirably displaced in phasing. To prevent this, the amplitude-modulation signal from source 11 is delayed by an integral number m of sample periods, the delay for carrier passage through digital multiplier 13 before being applied to adder 12. Delay of signal from source 11 is shown as being provided by a first-in/first-out (FIFO) buffer memory 23. The unmodulated carrier signal applied as multiplier signal to digital multiplier 14 will tend to be too far advanced in phase by an amount of time equal to the combined delay encountered by carrier passage through digital multiplier 13 and adder 12 which combined delays extend over an integral number n sample periods. This tendency is countered by introducing an n-sample delay into the unmodulated carrier applied to digital multiplier 14 using FIFO buffer memory 24. Alternatively, equivalent delay arrangements can be made. E.g., unmodulated carrier signal may be inverted to advance its phase relative to the carrier component of amplitude-modulation signal applied at the input port of adder 12 and then the unmodulated carrier signal may be delayed in its application to digital multiplier 13 and still further delayed in its application to digital multiplier 14.

In practice, the i-sample delay through elements 13, 12, 14 and 15 usually reposes primarily in the multiplier 13. The delay in adder 12 is usually short. The multiplication step in multiplier 14 is essentially a step of synchronous detection, and the multiplier for the adder 12 sum output as multiplicand can be simply a one-bit signal indicating the polarity of a carrier signal. This facilitates fast multiplication by element 14. For example, if adder 12 is of a type supplying both sum output signal and its complement, multiplier 14 can be simply a multiplexer selecting the appropriate adder output signal. Multiplier 15 is usually a decrementer comprising no more than a subtractor and a simple multiplier for calculating the decrement. The simple multiplier may be just a bit place shifter or may be a bit place shifter and a digital multiplier multiplying error signal by only a one-or two-bit multiplier. Multiplier 13 is preferably an accurate digital multiplier for finding the product of multi-bit multiplier and multi-bit multiplicand, however, so the carrier residue in adder 12 output signal is suppressed as completely as possible.

The operation of the FIG. 1 and FIG. 2 AM detectors, which operate on a sampled-data basis, can be analyzed using linear algebra by introducing the unit delay operator $z^{-1}$. The sampled-data time base is nT where n takes on successive integer values and T is the time interval between successive ones of the regularly recurring samples. An unmodulated carrier signal C(nT) and an input signal S(nT) are defined as follows.

$$C(nT) = A_c \cos (2\pi f_c nT) \quad (1)$$

$$S(nT) = A_c M(nT) \cos (2\pi f_c nT) \quad (2)$$

$A_c$ is the amplitude of the unmodulated carrier; $f_c$ is the frequency of the unmodulated carrier; and M(nT) is the modulating function encoded in the input signal.

From the circuits of FIGS. 1 and 2 the following equations (3) and (4) may be written, R(nT) being the response at the sum output port of adder 16, E(nT) being the encoded error signal at the difference output port of subtractor 12, and I(nT) being a baseband interfering signal accompanying S(nT).

$$R(nT) = R(nT)z^{-i} + \mu E(nT)C(nT) \quad (3)$$

$$E(nT) = S(nT) + I(nT) - R(nT)z^{-i}C(nT) \quad (4)$$

Equation (3) essentially describes the addition in adder 16, and equation (4) essentially describes the subtraction in subtractor 12. In the FIG. 1 AM detector i has the value unity. $R(nT)z^{-i}$ is multiplier 13 product output signal; one must remember FIG. 2 multiplier 13 was presumed to have i clock intervals delay therethrough. E(nT) is eliminated between equations (3) and (4) to generate the following equation (5).

$$R(nT) = R(nT)z^{-i} + \mu S(nT)C(nT) + \mu I(nT)C(nT) - \mu R(nT)z^{-i}C^2(nT) \quad (5)$$

Equation (5) is expanded by substituting values for C(nT) and S(nT) from equations (1) and (2) to generate equation (6), following.

$$R(nt) = R(nT)z^{-i} + \mu A_c^2 M(nT) \cos^2(2\pi f_c nT) + \mu A_c I(nT) \cos(2\pi f_c nT) - \mu A_c^2 R(nT)z^{-i} \cos^2(2\pi f_c nT) \quad (6)$$

The well-known trigonometric identity $\cos^2 A = (1 + \cos 2A)/2$ can be used to reduce equation (6) to equation (7) following.

$$R(nT) = R(nT)z^{-i} + (\mu A_c^2/2) M(nT) + (\mu A_c^2/2) M(nT) \cos[2(2\pi f_c nT)] + \mu A_c I(nT) \cos(2\pi f_c nT) - (\mu A_c^2/2) R(nT)z^{-i} - (\mu A_c^2/2) R(nT)z^{-i}[\cos 2(2\pi f_c nT)] \quad (7)$$

Rearranging, equation (8) is formed which is solved for R(nT) in equation (9)

$$R(nT)\{1 + [(\mu A_c^2/2) - 1]z^{-i}\} = (\mu A_c^2/2) M(nT) + \mu A_c I(nT) \cos(2\pi f_c nT) + (\mu A_c^2/2)[M(nT) - R(nT)z^{-i}] \cos[2(2\pi f_c nT)] \quad (8)$$

$$R(nT) = (\mu A_c^2/2) \{1 + [(\mu A_c^2/2) - 1]z^{-i}\}^{-1} M(nT) + \mu A_c\{1 + [(\mu A_c^2/2) - 1]z^{-i}\}^{-1} I(nT) \cos(2\pi f_c NT) + (\mu A_c^2 2) \{1 + [(\mu A_c^2 2) - 1]z^{-i}\}^{-1} [M(nT) - R(nT)z^{-i}] \cos[2(2\pi f_c nT)]. \quad (9)$$

Analyzing equation (9), the first term of R(nT) is a baseband term that equals M(nT), the modulating function encoded in the input signal, multiplied by a factor having constant amplitude and phase shift associated therewith. The second term of R(nT) comprises the sidebands of the first harmonic of carrier frequency encoding the frequency-translated baseband interferring signal I(nT), if such exists. The third term of R(nT) comprises the sidebands of the second harmonic of carrier frequency. To the extent that M(nT) tracks $R(nT)z^{-1}$ these second harmonic sidebands are suppressed.

Consider I(nT) as being zero and $R(nT)z^{-i}$ to approximate M(nT) sufficiently closely that the second-harmonic response can be considered negligible compared to the baseband response. Then the baseband system function of the amplitude-modulation system, R(nT)/M(nT), has the value set forth in equation (10).

$$R(nT)/M(nT) = (\mu A_c^2/2)\{1 + [(\mu A_c^2/2) - 1]z^{-i}\}^{-1} \quad (10)$$

This baseband system function describes a low-pass digital filter of infinite-impulse-response or IIR, type as one skilled in the art of digital filter design will appreciate. To be stable, the poles of an IIR digital filter must fall within the unit circle in the z-transform domain. That is, the following condition must be satisfied for loop stability.

$$-1 < (\mu A_c^2/2) - 1 < 1 \quad (11)$$

$$0 < (\mu A_c^2/2) < 2 \quad (12)$$

$$0 < \mu < (4/A_c^2) \quad (13)$$

It can be shown that the fastest acquisition of tracking by the principal feedback loop obtains when $\mu = 2/A_c^2$. When $\mu = 2/A_c^2$, R(nT) has a baseband value M(nT). The second-harmonic term of R(nT) becomes $[M(nT) - R(nT)z^{-i}] \cos[2(2\pi f_c nT)]$. M(nT) is closely approximated by $R(nT)z^{-i}$, if there are many samples per cycle of carrier; in such case the second-harmonic term becomes negligible, as previously assumed.

One may wish to choose mu smaller than $2/A_c^2$ to improve the capability of the FIG. 1 or FIG. 2 AM detector to reject noise accompanying the input signal S(nT). The smaller value of mu makes the baseband system function as an integrator, introducing a 6dB/octave roll-off into the loop and making it less responsive to noise at frequencies remote from carrier. Further low-pass filtering may be introduced between output terminal 17 and node 19 for reducing open-loop response to noise at these frequencies even more. The reduction of open-loop response to frequencies remote from carrier lessens the accuracy with which the output signal tracks the modulating signal.

The foregoing analysis assumed multiplier 14 to multiply encoded error signal E(nT) with a cosine wave as carrier signal in the sychronous demodulation of E(nT). Where multiplier 14 is of the type receiving a one-bit signal indicating the polarity of the carrier signal analysis is similar except for the C(nT) term in equation (3) being replaced by the following series describing the square wave carrier.

$$P(nT) = 2 \sum_{p=0}^{\infty} (-1)^p 2[(2p + 1)\pi]^{-1} \cos[(2p + 1)2\pi f_c nT] \quad (14)$$

The third and higher odd-order harmonics of cos $(2\pi f_c nT)$ give rise to increase in higher-order harmonic structure in R(nT). The baseband system function has the following value.

$$R(nT)/A_c M(nT) = (\mu A_c/\pi)\{1 + [(\mu A_c/\pi) - 1]z^{-i}\}^{-1} \quad (15)$$

The criteria for loop stability is as follows.

$$0 < \mu < (\pi/A_c) \quad (16)$$

In addition to a $(2\mu A_c/\pi)[M(nT) - R(nT)z^{-i}]$ cos $[2(2\pi f_c nT)]$ second harmonic term generated from the $(4/\pi) \cos(2\pi f_c nT)$ term of P(nT), there is an additional $(-2\mu A_c/3\pi)[M(nT)-R(nT)z^{-i}]\cos[2(2\pi f_c nT)]$ second harmonic term generated from the $-(4/3\pi)\cos 3(2\pi f_c NT)$ term of P(nT). Interestingly, these second order terms are of opposed phase, so the resultant $(4\mu/A_c 3\pi)[M(nT)-R(nT)z^{-i}]\cos[2(2\pi f_c nT)]$ second-harmonic term is of a reduced amplitude. When $R(nT)z^{-i}$ tracks $M(nT)$ with reasonable precision this resultant second-harmonic term is small.

Analyses similar to the foregoing ones can be performed for S(nT) being a pulse-amplitude-modulated (PAM) signal. When S(nT) is a PAM signal, the source 10 of unmodulated carrier signal supplies a square wave signal rather than a cosine wave signal, of course.

Variants of the FIG. 1 and FIG. 2 detectors are possible wherein linear combiner 12 is operated as an adder, rather than as a subtractor. This is made possible by the unmodulated carrier signal from source 10 being of opposite phase to, rather than the same phase as, the carrier of the first amplitude-modulation signal (or what the carrier of the first AM signal would be if it were not suppressed). Other variants wherein the predicted input signal is complemented before application to digital multiplier 13 are also possible. The FIG. 1 and 2 detectors can detect amplitude-modulation in the presence of carrier, as well as when carrier is suppressed. The output signal will contain a non-zero direct component when the carrier is not suppressed that causes the output signal to be of constant polarity, rather than alternating polarity.

Figure 3:
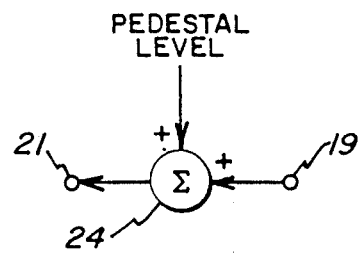
FIG. 3 is a schematic diagram of modification that can be made to either of the DSB AM detectors of FIGS. 1 and 2 better to suit it to detecting double-sideband amplitude-modulation signal with full carrier or with only partially suppressed carrier, any of which modified DSB AM detectors embodies the present invention.

FIG. 3 shows a modification that can be made to either the FIG. 1 or FIG. 2 detector (or to any variants of either of them as described in the previous paragraph) to cause the detector output signal to exhibit symmetrical positive and negative excursions when the double-sideband first AM signal that is to be detected contains a carrier signal component. Conductor 20 is replaced by a linear combiner 24 operated as an adder having a first addend input port connected from interface 19 to receive the predicted input signal, and having a second addend input port receptive of a constant-value pedestal signal to be added to the predicted input signal. The resulting sum signal at the output port of linear combiner 24 is applied via interface 21 to the multiplier input port of digital multiplier 13. Responsive to the pedestal signal component in the sum signal, multiplier 13 admixes a carrier component in the second AM signal generated as its product output signal. Linear combiner 12 combines this carrier component and the carrier component in the first AM signal destructively, so the third AM signal is still a suppressed-carrier double-sideband AM signal as in the embodiments of FIGS. 1 and 2. The remaining operation can then be the same as in the unmodified FIG. 1 or FIG. 2 detector. If the carrier in the first and second AM signals is not suppressed at all, multiplier 13 can be of a two-quadrant type, since the sum signal from linear combiner 24 will be of unchanging polarity.

Figure 4:
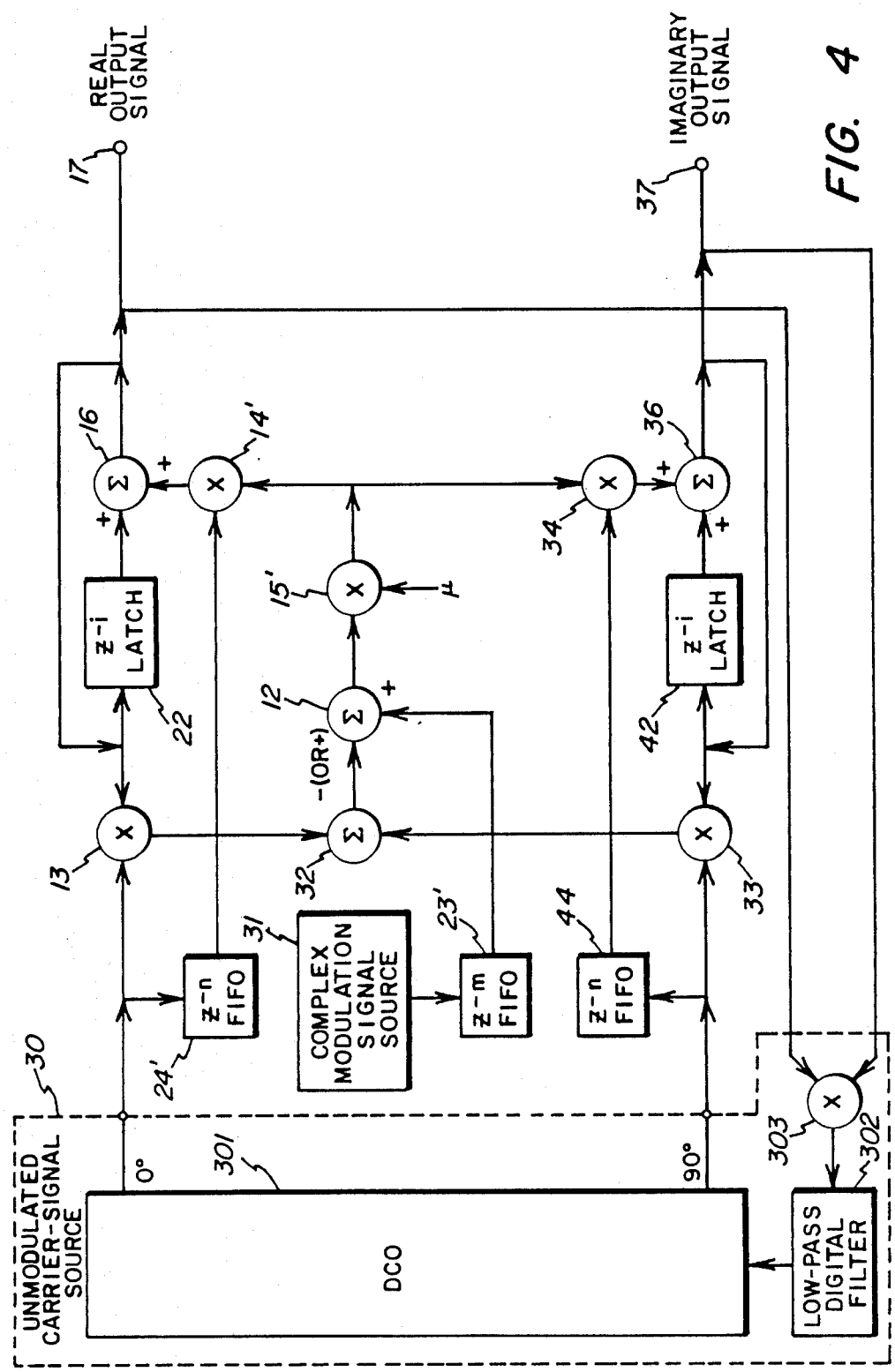
FIG. 4 is a schematic diagram of a detector for the real and imaginary components of the modulating signal used to generate in-phase and quadrature sidebands of carrier in a complex carrier modulation process, which detector embodies the invention and is shown connected for detecting double-sideband suppressed-carrier amplitude-modulation signals the carrier phase and frequency of which are not known.

FIG. 4 shows a complex-amplitude-modulation detector that may be viewed as a modification of the FIG. 2 amplitude-modulation detector. The detection of the real component of the complex modulating signal, which is contained in the in-phase sidebands of the complex-modulation signal supplied from a source 31 thereof, takes place primarily in elements 32, 12, 13, 14', 15', 16, 22, 23' and 24', which latter elements correspond to similarly numbered elements in the FIG. 2 amplitude-modulation detector. Multipliers 15' and 14' appear in reverse order from multipliers 14 and 15 in the FIG. 2 AM detector in order that multiplier 15' may be shared in the detection of the imaginary component of the complex modulating signal. FIFOs 23' and 24' have their delay extended to take into account the additional delay incurred through linear combining element 32, and FIFO 24' has its delay further extended to take into account delay through multiplier 15' if necessary.

The detection of the information in the in-phase sidebands and the information in the quadrature sidebands of a complex-modulation signal can be carried forward on a separable basis when conventional synchronous detectors are employed. Attempting to detect the information in a complex-modulation signal on a separable basis, using a detector of the type shown in FIG. 2 to detect the real component of the modulating signal as encoded by amplitude modulation in the in-phase sidebands does not work, however. In order to obtain a complex error signal that can be resolved into real and imaginary components that are uncontaminated by residual carrier, its even harmonics and even-order sidebands, the complete complex-modulation signal must be predicted for comparison with the incoming complex-modulation signal from the source 31.

In the FIG. 4 complex-modulation detector the predicted in-phase sidebands of the carrier (plus the predicted carrier itself, if it is not suppressed) are supplied as product output signal from multiplier 13 just as in the FIG. 2 amplitude-modulation detector. However, they have added to them in a linear combining element 32 (e.g., an adder) the predicted quadrature sidebands of the carrier, as supplied as product output signal from a multiplier 33, to generate a predicted value for the complete complex-modulation signal supplied from source 31. This prediction is compared in linear combining element 12 with the signal from source 31 to generate a complex error signal. The multiplier 14' synchronously detects the real component of the complex error signal, owing to an in-phase (0°) carrier being applied thereto from source 30 of unmodulated carrier, and rejects the imaginary component of the complex error signal. This real component of the error signal is supplied to adder 16 to be accumulated with previous real components of error signal to generate the real component of the complex-modulation detector output signal.

The detection of the imaginary component of the complex modulating signal from the quadrature sidebands of the complex-modulation signal takes place primarily in elements 32, 12, 33, 34, 15', 36, 42, 23' and 44. Elements 33, 34, 36, 42, and 44 correspond substantially to elements 13, 14', 16, 22' and 24' which aid in detecting the in-phase component of the complex-modulation signal. Elements 32, 12, 33, 34, 15', 36, 42, 23' and 44 detect the imaginary component of the complex modulating signal because multiplier 34 receives quadrature (90°) carrier from source 30. Accordingly, multiplier 34 synchronously detects the imaginary component of the complex error signal and rejects the real component of the complex error signal. The imaginary component of the complex error signal is accumulated with previous imaginary components of error signal to generate the imaginary component of the complex-modulation detector output signal, which is available at an output signal terminal 37.

The operation of the FIG. 4 complex-amplitude-modulation detector can be analyzed, beginning with a redefinition of the input signal as follows.

$$S(nT) = A_c M(nT) \cos(2\pi f_c nT + \theta) \tag{17}$$

The definition of an in-phase (real) unmodulated carrier signal C(nt) remains the same as in equation (1). A quadrature-phase (imaginary) carrier signal Q(nt) is defined as follows.

$$Q(nT) = A_c \sin(2\pi f_c nT) \qquad (18)$$

The response of the FIG. 4 complex-amplitude-modulation detector comprises a real component $R_r(nT)$ supplied at output terminal 17 and an imaginary component $R_i(nT)$ supplied at an output terminal 37. Adder 32 supplies an estimate signal G(nT) to subtractor 12 to be subtracted from S(nT) to generate a complex-amplitude-modulation signal E(nT) encoding a complex error signal.

$$G(nT) = R_r(nT)z^{-i}C(nT) + R_i(nT)z^{-i}Q(nT) \qquad (19)$$

$$E(nT) = S(nT) - G(nT) \qquad (20)$$

Equations (21) and (22) following describe the integrator "inner" feedback loops comprising elements 16, 22, and comprising elements 36, 42, respectively, as well as portions of the "outer" feedback loops in which they are respectively situated.

$$R_r(nT) = R_r(nT)z^{-i} + \mu E(nT)C(nT) \qquad (21)$$

$$R_i(nT) = R_i(nT)z^{-i} + \mu E(nT)Q(nT) \qquad (22)$$

Equations 19–22 can be solved for $R_r(nT)$ and $R_i(nT)$. It is helpful to expand equation (17) using the well-known trigonometric formula $$\cos(A+B) = \cos A \cos B - \sin A \sin B,$$

to obtain equations (23) and (24) following.

$$\begin{aligned}S(nT) &= A_c M(nT) \cos\theta \cos(2\pi f_c NT) - \\ & \quad A_c M(nT) \sin\theta \sin(2\pi f_c NT) \\ &= M(nT) C(nT) \cos\theta - M(nT) Q(nT) \sin\theta\end{aligned} \qquad (23)$$

Equations (19) and (23) are substituted into equation (20) to form equation (24) following.

$$E(nT) = [M(nT) \cos\theta - R_r(nT)z^{-i}]C(nT) - [M(nT) \sin\theta + R_i(nT)z^{-i}]Q(nT) \qquad (24)$$

Equation (24) is substituted into equations (21) and (22) to generate equations (25) and (26) following.

$$R_r(nT) = R_r(nT)z^{-1} + \mu[M(nT)\cos\theta - R_r(nT)z^{-i}]C^2(nT) - [\sin\theta)M(nT) + R_i(nT)z^{-i}]C(nT)Q(nT) \qquad (25)$$

$$R_i(nT) = R_i(nT)z^{-1} + \mu[M(nT)\cos\theta - R_r(nT)z^{-i}]C(nT)Q(nT) - \mu[M(nT)\sin\theta + R_i(nT)z^{-i}]Q^2(nT) \qquad (26)$$

Of interest in equations (25) and (26) are the terms having both C(nT) and Q(nT) as factors.

$$C(nT)Q(nT) = A_c \cos(2\pi f_c nT) A_c \sin(2\pi f_c nT) \qquad (27)$$

Using the trigonometric identity $\sin A \cos B = [\sin(A+B)]/2 + [\sin(A-B)]/2$, equation (27) reduces to equation (28).

$$C(nT)Q(nT) = (A_c^2/2) \sin[2(2\pi f_c nT)] \qquad (28)$$

This means the terms in equations (25) and (26) having both C(nT) and Q(nT) as factors give rise to second-harmonic terms, but do not give rise to baseband terms. Accordingly, baseband system functions $R_r(nT)/M(nT)$ and $R_i(nT)/M(nT)$ can be obtained from equations (23) and (26) in ways much the same way that R(nT)/M(nT) baseband system function was obtained, earlier in the specification, for the FIG. 2 AM detector.

$$R_r(nT)/M(nT) = (\cos\theta) \cdot (\mu A_c^2/2) \cdot \{1 + [(\mu A_c^2/2) - 1]z^{-1}\}^{-1} \qquad (29)$$

$$R_i(nT)/M(nT) = (\sin\theta) \cdot (\mu A_c^2/2) \cdot \{1 + [(\mu A_c^2/2) - 1]z^{-1}\}^{-1} \qquad (30)$$

The stability factor mu is determined to be the same as for the FIG. 2 AM detector. One observes the vector sum of $R_r(nT)$ and $R_i(nT)$ has the same value as R(nT) when $\theta = 0$, as in the FIG. 2 AM detector. Analysis of the second-harmonic terms shows them to diminish to low value when $R_r(nT)z^{-i}$ tracks $\cos\theta \, M(nT)$ and when $R_i(nT)z^{-i}$ tracks $\sin\theta \, M(nT)$.

Where it is desired to choose unmodulated carrier phase to suppress imaginary output signal and generate only real output signal, the source 30 of unmodulated carrier may include, as tracking oscillator, a DCO 301 controlled by filtered automatic-frequency-and-phase-control (AFPC) signal supplied from the output port of a digital low-pass filter 302. The unfiltered AFPC signal can be obtained similarly to the way they are in the well-known Costas loop, by multiplying together in a digital multiplier 303 the real and imaginary complex-modulation detector output signals as supplied to output terminals 17 and 37. The multiplier 303 may, as known, be a type that responds only to the sign bits of non-zero multiplier and multiplicand signals, in order to simplify multiplier construction and reduce latency therethrough.

Those skilled in the art of digital phase-locked loops (PLLs) will discern many ways to provide for the operation of the digital PLL controlling DCO 301 and will be able to choose from a wide variety of known DCO designs to be incorporated into the loop. This is largely incidental to the invention, which can be successfully operated without undue trial and experimentation using any of these design alternatives. DCOs using counters to count controlled-rate pulses for addressing sine and cosine look-up tables from read-only memory (ROM) are popular amongst digital designers. DCOs generating sine and cosine waves by accumulation techniques avoid the need for ROM look-up tables. A DCO type which is particularly good in terms of cosine and sine wave purity can be designed based on the oscillator described by F. F. Yassa in U.S. patent application Ser. No. 222,480, filed 21 July 1988, entitled "SAMPLED-DATA SINE-WAVE AND COSINE-WAVE GENERATION BY ACCUMULATION" and assigned to General Electric Company.

The FIG. 4 complex-modulation detector may be used in systems for detecting phase-shift keying (RSK) signals having two or four phases, supposing that the bandwidth limitations in the PSK signals cause the phase modulation to be sufficiently continuous in nature. In such cases, the FIG. 4 complex-modulation detector may be followed by a symbol synchronizer, as known in the art.

Figure 5:
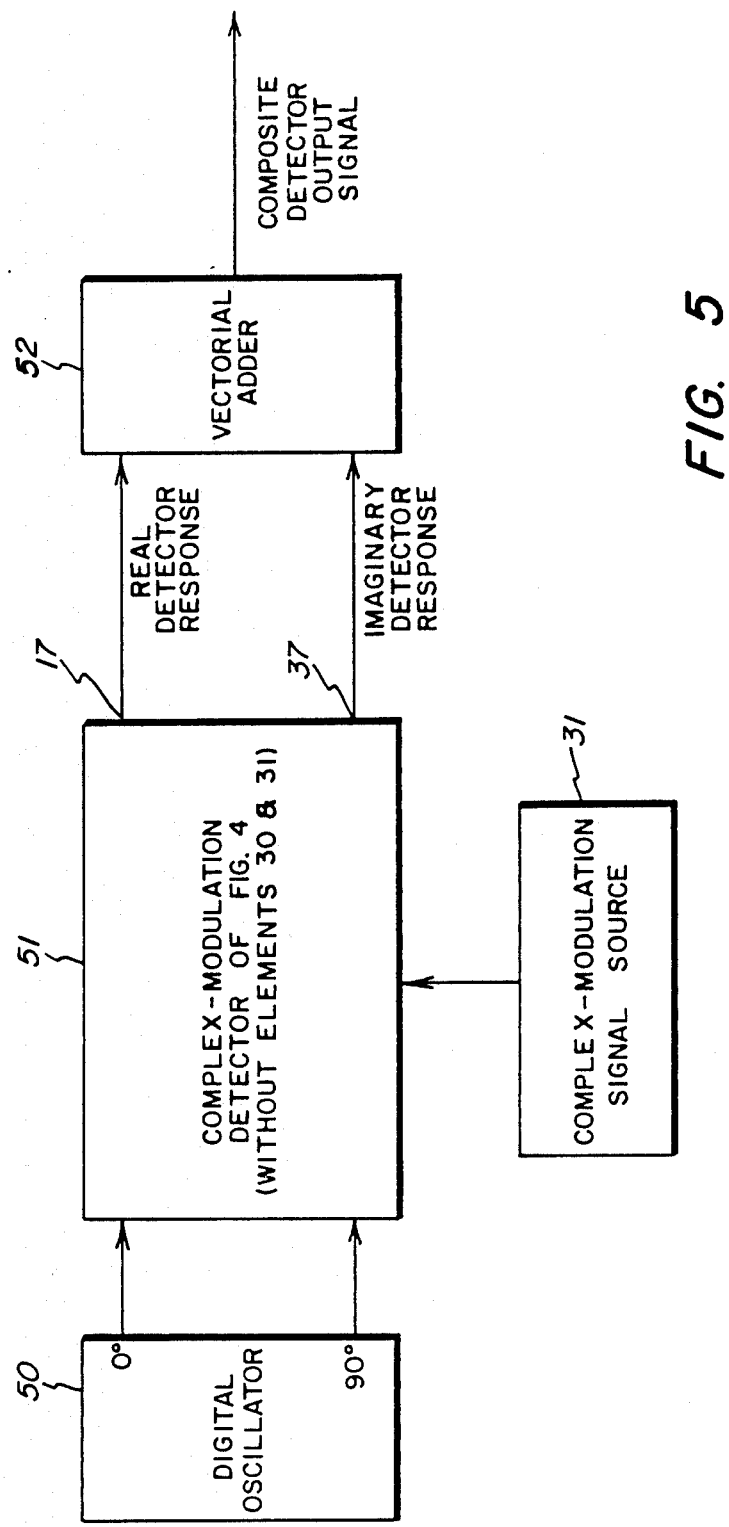
FIG. 5 is a schematic diagram of the complex-modulation detector connected for detecting complex modulation with a beat-frequency oscillator and vectorially adding the real and imaginary components of detected signal.

FIG. 5 shows a variation of the FIG. 4 complex-modulation detector wherein unmodulated carrier signal source 30 is replaced by a fixed-frequency oscillator 50 supplying prescribed 0° and 90° output phases. This arrangement is possible where a global clock controls the frequency of the complex-modulation detector and of the complex-modulation generator supplying its signal (i.e., source 31). The relative phasings of the carriers from sources 31 and 50 may be known from the global clock as well as (for example) when the phases are offset in varying degrees to rotate a phasor quantity in a complex-frequency computing device. In such a system it is usually desirable to have the output signal in complex form, and the real and imaginary components of the detector output signal are not further combined together. The relative phasings of like-frequency carriers from sources 31 and 50 may not be known, for example, as in a transmission system in which the transmitting and receiving stations have respective very stable local clocks, such as quality crystal beat-frequency oscillators or atomic clocks. Because of shortness of time for locking, it may be undesirable to attempt to exert automatic phase control (APC) on the oscillator that generates unmodulated carrier for the composite-modulation detector. In analog transmission systems noise, multipath or fading problems may make APC of the oscillator undesirable; this is of consequence in analog equivalents of the digital circuitry shown in FIG. 4 or in systems where the analog transmissions are subsequently converted to digital form for detection.

FIG. 5 assumes that the relative phasings are not known and provides a vectorial adder 52 to add vectorially the real and imaginary components of the detector output signal to generate a composite detector output signal. Several ways of doing vector addition are known. Vector addition may be accomplished by dividing the smaller of the signals from terminals 17 and 37 by the larger to obtain a tangent or cotangent function, then using a look-up table (LUT) read-only memory (ROM) to obtain the secant or cosecant function which is used to multiply one of the signals from terminals 17 and 37 to generate the vector sum. Vector addition may also be accomplished by a square rooting of the sum of the squares of the signals from terminals 17 and 37, which procedures are usually implemented using logarithm and anti-logarithm LUT ROMs. Another approach is to use a cordic rotator to introduce a phase rotation of the phasor represented by the real and imaginary detector responses. Various phasor rotations are tested to determine which respectively maximizes and minimizes the real and imaginary components of the ultimate response.

A way to avoid the complexities of actual vectorial addition is to use a training signal—e.g., a burst of full-amplitude in-phase carrier—to evaluate the real and imaginary responses of the detector under known conditions, then adjusting the gain for one of these responses to prescribed level for introducing the secant or cosecant multiplier needed to correct that response to the vector sum.

Figure 6:
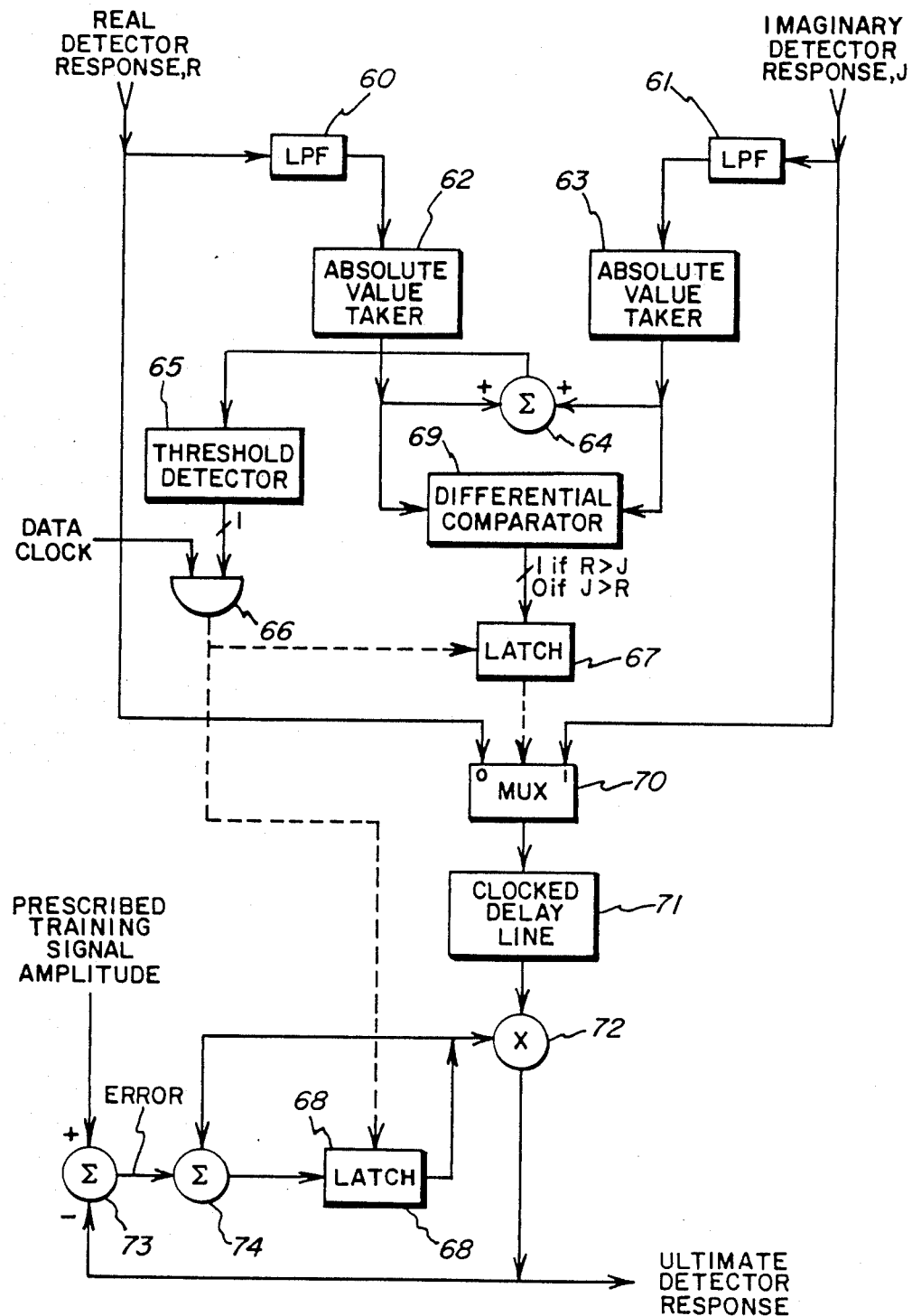
FIG. 6 shows apparatus which may replace the vectorial adder in the FIG. 5 complex-modulation detector when a specified amplitude of carrier is sent as a training signal at pre-arranged or otherwise specified times.

FIG. 6 shows a system responding to a training signal for selecting the larger of the real and imaginary responses of a complex-modulation detector and adjusting its gain to provide an ultimate detector response. The training signal is unmodulated carrier transmitted previous to transmission of suppressed-carrier double-or single-sideband amplitude modulation. The real and imaginary responses from complex-modulation detector 51 are applied as input signals to digital low-pass filters 60 and 61, respectively. Filters 60 and 61 have cut-off frequencies below the lowest modulating signal frequency, so their responses are zero-valued during the usual suppressed-carrier transmissions. When the unmodulated carrier used as training signal is transmitted, at least one of the zero-frequency (or direct) responses of these filters 60 and 61 has an appreciable value.

The responses of filters 60 and 61 are supplied to respective circuits 62 and 63 for taking absolute value. Absolute value of a two's complement number is customarily obtained by exclusive-ORing its sign bit with each of its other bits to obtain result bits equalling its other bits for positive numbers and equalling the complements of its other bits for negative numbers. (The sign bit may be shifted to least significant bit position by wired shift and added to the result, to obtain the precise absolute value of the two's complement number when it is negative as well as when it is positive, if desired.) These absolute values are added in a linear combining apparatus 64, the sum output signal of which is supplied to a threshold detector 65. Threshold detector 65 can be an OR gate for the more significant bits of its input signal. The output signal of threshold detector 65 is a ONE when it detects the presence of unmodulated carrier and is otherwise a ZERO.

Threshold detector 65 output signal selectively enables the application of data clock signals to latches 67 and 68, the functions of which will be explained further on. This selective enablement may be provided by an AND gate 66 ANDing data clock signal and threshold detector 65 output signal, supposing latches 67 and 68 to latch on ONE control signal and the data clock signal to alternate between ONE and ZERO at data clock rate.

A differential comparator 69 compares the magnitudes of the real and imaginary responses to unmodulated carrier signal, as supplied from absolute value circuits 62 and 63, to determine which is the larger. Comparator 69 can be a two's complement adder arranged as a subtractor with the sign bit of the difference supplying a single-bit indication of which of the real and imaginary responses is the larger. The single-bit output signal from comparator 89 is supplied to the latch 67 as input signal and is recurrently latched when unmodulated carrier is detected. Latch 67 output signal is supplied as control signal to multiplexer 70 to condition it to select the larger of its input signals as its output signal. The larger of the real and imaginary detector responses supplied as input signals to multiplexer 70 is the one of those responses modulated on the digital oscillator 50 carrier phasing closest to transmitted carrier phasing.

The output signal from multiplexer 70 is delayed by a clocked delay line 71. The delayed response from delay line 71 is supplied as a multiplier input signal to a four-quadrant digital multiplier 72, which receives as its multiplicand input signal the output signal from the latch 68. (For certain types of digital multiplier 72 latch 68 may be the icand register of the digital multiplier). During usual operation, the product signal from digital multiplier 72 is the ultimate, or final, detector response. During the time training signal is applied, the output signal from digital multiplier 72 measures the detected amplitude of the unmodulated carrier. This detected amplitude is to be regulated to a prescribed training signal value by an electronic servomechanism loop including the digital multiplier 72, which loop adjusts the multiplicand signal stored in latch 68.

To implement this regulation, the product output signal from digital multiplier 72 is subtracted from the prescribed training signal value in a linear combining apparatus 73 to generate an error signal indicative of how much the detected amplitude of the unmodulated carrier departs from the prescribed training signal value. This error is added in a linear combining apparatus 74 to the previous contents of latch 68 to generate its updated contents, the internal loop containing elements 68 and 74 operating as an integrator for error signal. The time over which the training signal is transmitted is long enough that the regulation of the detected amplitude of the unmodulated carrier to prescribed value will invariably be completed; and this time can be shorter by reason of selecting the larger of the real and imaginary detector responses to gain-control, rather than arbitrarily selecting one of these responses.

When the training signal is no longer transmitted at an amplitude sufficient to cause threshold detector 65 response to be a ONE, AND gate 66 responds with a ZERO to control the latches 67 and 68 for maintaining the values last entered into them when the training signal was so transmitted. Multiplexer 70 responds to the held content of latch 67 to continue to select to delay line 71 and then a multiplier 72 the one of the real and imaginary detector responses that is the larger during training signal transmission. Latch 68 retains the multiplicand input signal for digital multiplier 72.

The reason the clocked delay line 71 is used is to assure that the full amplitude of the training signal will continue to be supplied as multiplier signal to digital multiplier 72, as the responses of the digital low-pass filters 60 and 61 to cessation of training signal decay with delay before threshold detector 65 response falls to ZERO. This avoids incorrect error signal being supplied to the integrating loop connection of elements 68 and 74 after the training signal is discontinued but before threshold detector 65 responds. In practice, it can be more efficient of digital hardware to replace delay line 71 by direct connection and instead to delay each of the real and imaginary detector responses as supplied to multiplexer 70. This presumes that the digital low-pass filters 60 and 61 are output-weighted FIR types incorporating the required delay lines in their input structure anyway.

Figure 7:
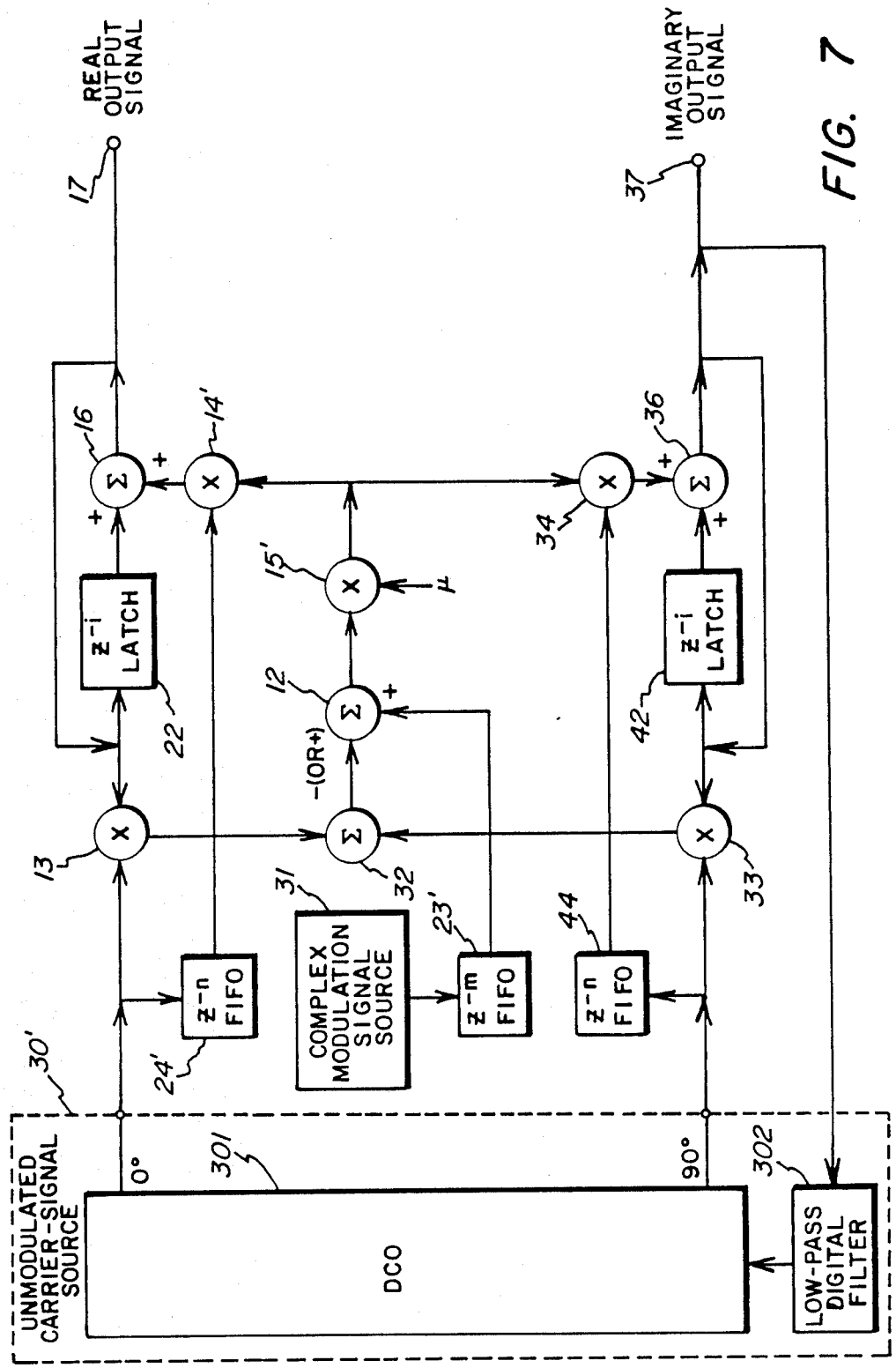
FIGS. 7 and 8 are each a schematic diagram of a modification of the FIG. 4 detector, useful for detecting real and imaginary components of a modulating signal contained in sidebands, accompanied by carrier.

FIG. 7 shows a modification of the FIG. 4 complex modulation detector that is useful when the carrier is not suppressed. The unmodulated carrier source 30' is modified in that DCO 301 receives as AFPC signal the low-pass response of digital filter 302 to the imaginary output signal at terminal 37. The automatic phase and frequency control signal is developed from direct (zero-frequency) signals that appear in the baseband when carrier is transmitted, rather than having to homodyne second-harmonic terms to baseband to obtain the control signal, as is necessary where the carrier is suppressed. The carrier is presumed to be real, so correct phase lock of DCO 301 is indicated by the direct component of imaginary output signal being zero in value. The FIG. 7 detector is especially useful as narrow band angular modulation detector with phase-modulation detection response, or as a detector for amplitude modulation in which carrier is not suppressed with amplified-modulation detection response being available at terminal 17. The "amplitude-modulation" response at terminal 17 can be low-pass filtered to provide automatic gain control to a radio receiver employing the FIG. 7 complex modulation detector as second detector. The FIG. 7 detector can also be adapted for use in stereophonic AM broadcast radio receivers.

Figure 8:
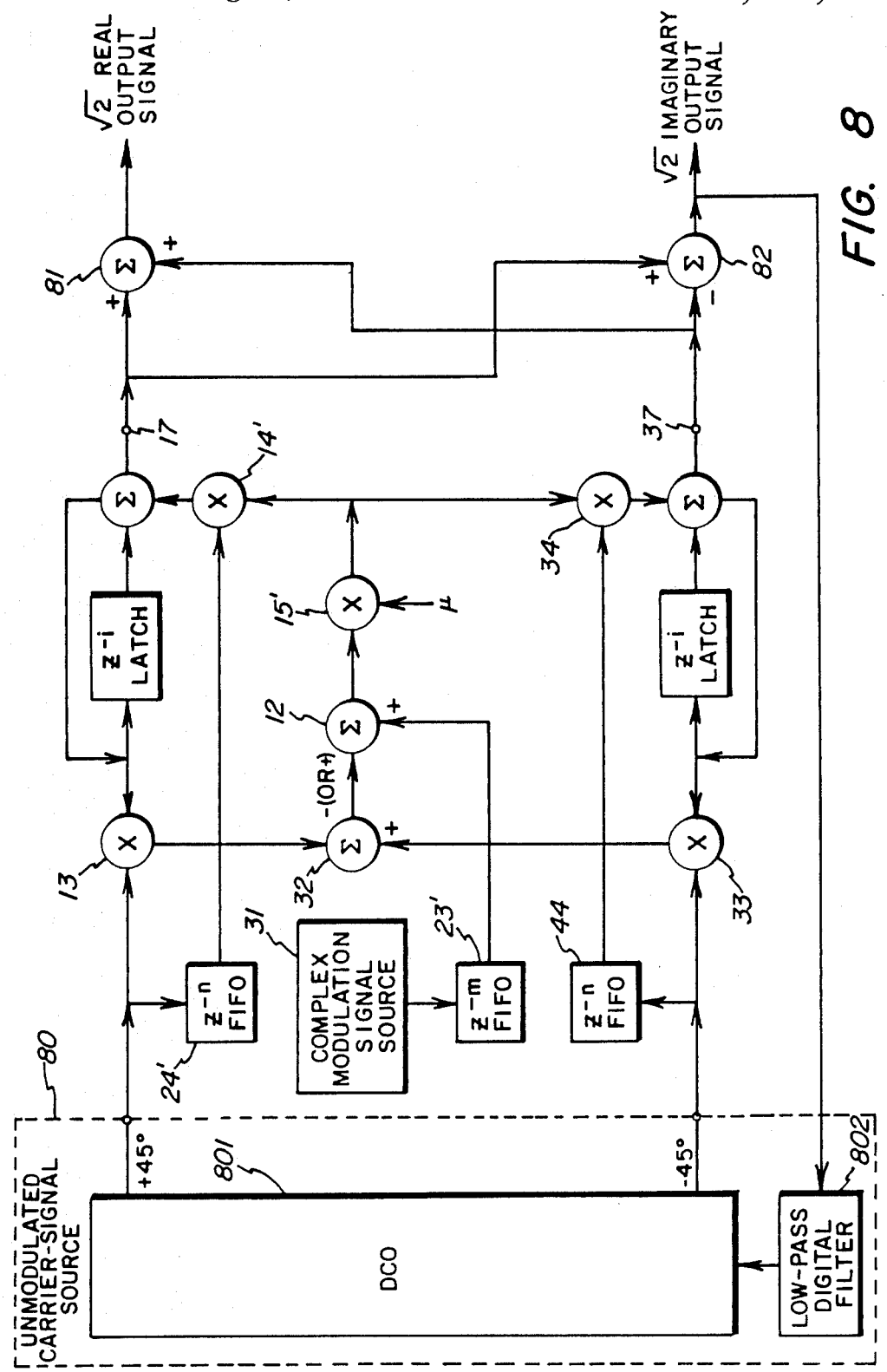

FIG. 8 shows another modification of the FIG. 4 complex modulation detector that is useful when the carrier is not suppressed. The source 30 of unmodulated carrier signal at 0° and 90° is replaced by a source 80 of unmodulated carrier signal at −45° and +45° phasings, causing the output signal at terminal 17 to be $2^{-0.5}$ times the sum of the real and imaginary components of the complex modulating signals and causing the output signal at terminal 37 to be $2^{-0.5}$ times the difference of the real and imaginary components of the complex modulating signals. The recovery of real and imaginary signals does not require further detector apparatus. An adder 81 adds the output signals at terminals 17 and 37 to recover at its sum output port the real output signal (as multiplied by the factor $2^{0.5}$), and a subtractor 82 subtracts the output signal at terminal 37 from the output signal at terminal 17 to recover at its difference output port the imaginary output signal (as multiplied by the factor $2^{0.5}$). A digital phase-lock loop for a digital controlled oscillator 801 in source 80 is provided by applying the imaginary output signal from subtractor 82 as an error signal to a digital low pass filter 802, which responds to supply AFPC signal to DCO 801.

Figure 9:
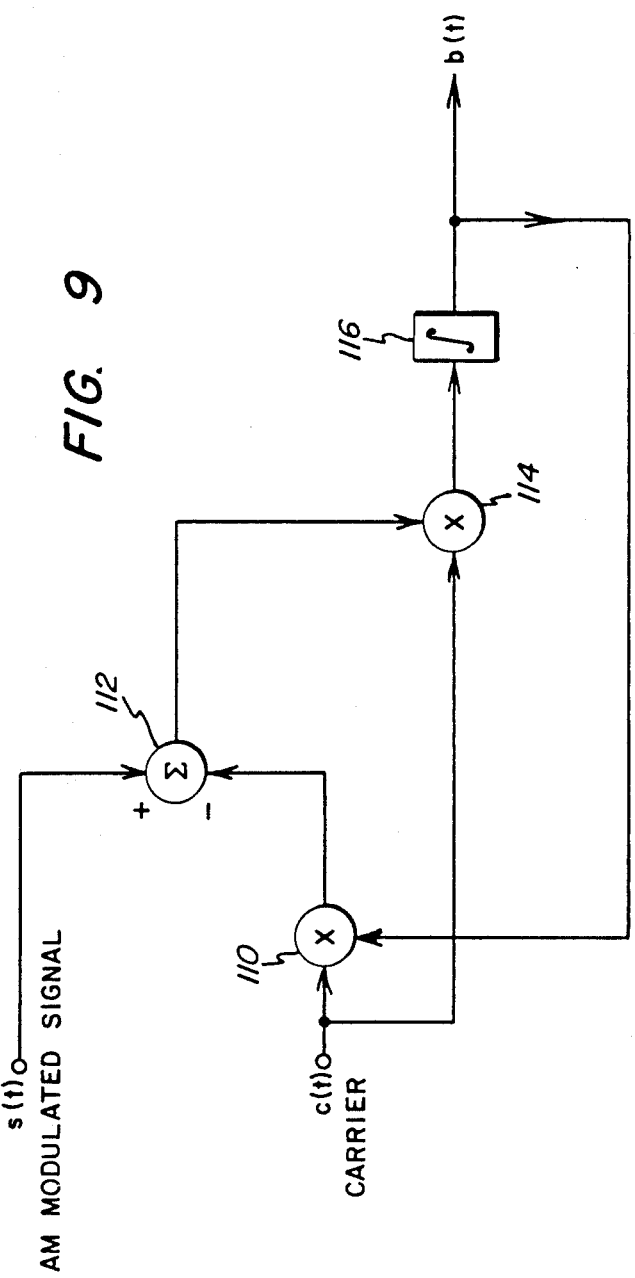
FIG. 9 is a schematic diagram of an analog version of an amplitude-modulation detector embodying the invention.

The FIG. 9 detector is useful, for example, as the second detector in a receiver for the AM stereophonic broadcasting system where left plus right (L+R) signal is encoded in the in-phase AM sidebands and left minus right (L−R) signal is encoded in the quadrature AM sidebands of a 550-1600 kHz radio-frequency carrier. Left and right signals are available at terminals 17 and 37. The real signal from adder 81 can be used to supply both left and right signals during monophonic reception, so there is no response to noise or incidental phase distortion in the quadrature sidebands. The imaginary signal from subtractor 82 can be band-pass filtered to recover stereophonic broadcast flag signal transmitted in the higher frequency portion of the imaginary signal spectrum, and the recovered flag signal can be used to operate an indicator of whether broadcasting is or is not stereophonic. Also, the FIG. 8 detector is useful as second detector in AM stereophonic broadcasting systems using low-modulation-index angular modulation to encode L−R information and amplitude modulation to encode L+R information. The real signal from the output port of adder 81 is the recovered L+R information and the imaginary signal from the output port of subtractor 82 is readily processed (e.g. de-emphasized) to recover L−R information. Left and right information is then recovered by simple additive and subtractive combining of the recovered L+R and L−R signals. Indeed, the adaptability of the FIG. 8 detector to decoding several known types of stereophonic AM broadcasting signals provides the basis for a universal stereophonic AM broadcasting receiver.

The FIG. 8 detector can also be used for detecting low-modulation-index angular modulation as used in mobile communications, the detected signal being available from the difference output port of subtractor 82.

FIG. 9 shows an analog version of an amplitude-modulation detector embodying the invention. The signals available to the FIG. 8 amplitude-modulation detector are a carrier signal with frequency $f_c$, which may be expressed as $$c(t) = A_c \sin(2\pi f_c t), \qquad (31)$$

and a modulated carrier signal, which may be expressed as $$s(t) = A_c m(t) \sin(2\pi f_c t). \quad (32)$$

Signal s(t) is a double-sideband suppressed-carrier (DSBSC) signal where t is the time variable and m(t) is the modulating signal to be detected. It is assumed that both signals c(t) and s(t) are in phase. If the signals are out of phase by an angle $\theta$, a gain error proportional to $\cos\theta$ is introduced as a consequence. This error can be corrected by analog apparatus analogous to the digital apparatus discussed in connection with FIG. 6. It should be noted that the carrier signal need not be sinusoidal, as long as it is periodic in nature.

As shown in FIG. 9, the carrier signal c(t) is supplied to one input of a multiplier 10. The other input of multiplier 10 receives the detected signal b(t). The product output signal b(t)c(t) of multiplier 10 is subtracted in a summer 12 from the amplitude-modulated signal s(t) to produce a difference signal s(t)−b(t)c(t). This difference signal is multiplied in a multiplier 14 by the carrier signal c(t) to produce a product signal [s(t)−b(t)c(t)]c(t) which is integrated in an integrator 16 to produce the detected signal b(t).

The adaptive demodulation method in FIG. 9 AM detector involves updating the analog coefficient of the adaptive structure in the form $$b(t) = b(0) + 2\mu \int_0^t e(t)c(t)dt, \quad (33)$$

where b(0) is the initial condition of the coefficient; mu is a design parameter that controls the detector stability, rate of convergence, and amount of leakage of carrier harmonics; and e is the error signal, which is given by $$e(t) = s(t) - b(t)c(t). \quad (34)$$

The FIG. 9 amplitude-modulation detector is distinguished by the following properties:
(1) The instantaneous value of b(t) tracks the modulating message at every instant t in amplitude and phase.
(2) The resulting demodulation is independent of the carrier amplitude, and the algorithm is normalizing in nature.
(3) The resulting signal is composed of the following components:
  (a) The detected message, represented by b(t); and
  (b) Even harmonics of the modulated carrier.
Attenuation of these modulated carrier harmonics depends on the carrier frequency as well as the message bandwidth. For constant-value messages, these even harmonics of the modulated carrier do not exist.
(4) For most applications, no further filtering need be used after the FIG. 9 AM detector. For high performance applications, some filtering may be necessary in order to remove the carrier harmonics. This filtering can be done with low selectivity filter realizations, since the separation provided by the FIG. 9 AM detector is already high. Accordingly, simple low-order filters can be used.

Figure 10:
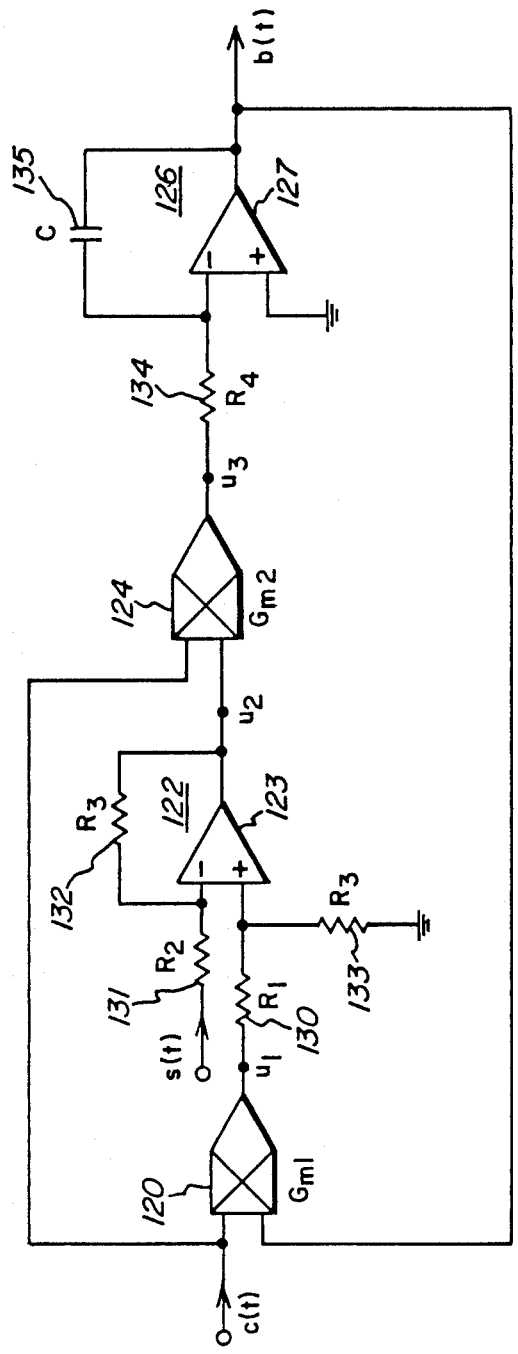
FIG. 10 is a more detailed schematic diagram of an all-analog-circuit implementation of the FIG. 9 DSB AM detector.

The FIG. 9 AM detector is implementable as shown in FIG. 10 with two analog, four-quadrant multipliers 20 and 24, an integrator 26 and a subtractor 22, corresponding to those elements 10 and 14, 16 and 12, respectively, in FIG. 8. The FIG. 9 detector can be simplified by substituting a sign multiplier for multiplier 24. Subtractor 22 is implemented with an operational amplifier 23 connected as a summing amplifier with input resistors 30 and 31, and a feedback resistor 32. Input resistor 30 has a resistance value of $R_1$ and couples the product output of multiplier 20 to the positive input terminal of operational amplifier 23. Input resistor 31 has a resistance value of $R_2$ and supplies the amplitude-modulated signal s(t) to the negative input terminal of operational amplifier 23. Feedback resistor 32 has a resistance value of $R_3$; and a bias resistor 33, also having a resistance value of $R_3$, is connected from the positive input terminal of operational amplifier 23 to ground.

Integrator 26 is implemented with a second operational amplifier 27 having a feedback capacitor 35 connected to its negative input terminal while its positive input terminal is connected to ground. An input resistor 34, having a resistance value $R_4$, supplies the product output signal from multiplier 24 to the negative input terminal of operational amplifier 27.

The product output signal of multiplier 20 is indicated in FIG. 9 as being $u_1$, which is defined by the expression $$u_1 = G_{m1}c(t)b(t), \quad (35)$$

where $G_{m1}$ is the gain of the multiplier. The output signal of summer 22 is $u_2$, which is defined by the expression $$u_2 = \left(\frac{R_3}{R_2}\right)\left[\left(\frac{R_2 + R_3}{R_1 + R_3}\right)u_1 - s(t)\right] \quad (36)$$

$$u_2 = \left(\frac{R_3}{R_2}\right)\left[\left(\frac{R_2 + R_3}{R_1 + R_3}\right)G_{m1}b(t)c(t) - s(t)\right]. \quad (37)$$

By designing the gain of multiplier 20 to be equal to the ratio of $R_1+R_3$ to $R_2+R_3$, that is, $$G_{m1} = \left(\frac{R_1 + R_3}{R_2 + R_3}\right), \quad (38)$$

then $$u_2 = \left(\frac{R_3}{R_2}\right)[b(t)c(t) - s(t)] = \left(\frac{R_3}{R_2}\right)[c(t)b(t) - s(t)]. \quad (39)$$

The output signal of multiplier 24 is $u_3$, which is defined by the expression $$u_3 = G_{m2}u_2c(t)[c(t)b(t) - S(t)]c(t) = \left(\frac{R_3}{R_2}\right)G_{m2}. \quad (40)$$

Integrating the output signal of multiplier 24 in integrator 26, $$b(t) = -\frac{R_3}{R_2 R_4 C} G_{m2} [c(t)b(t) - s(t)]c(t)dt. \quad (41)$$

The design constant $2\mu$ is defined as $$2\mu = \frac{R_3}{R_2 R_4 C} G_{m2}, \quad (42)$$

and the error e(t) is again defined as $$e(t) = s(t) - b(t)s(t),\qquad(43)$$

so that the output signal of integrator 26 is $$b(t) = 2\mu \int_0^t e(t)c(t)dt.\qquad(44)$$

The results obtained by use of analog AM detectors embodying the invention are dependent on the degree of linearity of the analog multipliers and the closeness of component matching. It is worth noting that no analog-to-digital conversion is necessary in order to perform the demodulation. The analog AM detector is suited to being constructed in switched-capacitor circuits for performing subtraction and integration being known in the art. A complex-modulation detector in analog form analogous to the complex-modulation detector shown in FIGS. 4, 5, 7 or 8 can also be constructed.

While only certain preferred features of the invention have been illustrated and described herein, many modifications and changes will occur to those skilled in the art and acquainted with the foregoing disclosure. It is, therefore, to be understood that the appended claims are intended to cover all such modifications and changes as fall within the true spirit of the invention.

What is claimed is:

1. A detector for a first continuous-wave-modulation signal encoding an input signal, said detector developing an output signal that decodes said input signal for application to subsequent circuitry and comprising:
   means for applying said first continuous-wave-modulation signal to said detector;
   means for supplying a carrier signal;
   means for modulating said carrier signal with a predicted input signal to generate a second continuous-wave-modulation signal encoding said predicted input signal in substantially the same way said first continuous-wave-modulation signal encodes said input signal;
   means for comparing the instantaneous amplitudes of said first and second continuous-wave-modulation signals to generate a third continuous-wave-modulation signal, which encodes an error signal indicative of any difference between said input signal and said predicted input signal;
   means for decoding the error signal encoded in said third continuous-wave-modulation signal;
   means for combining said decoded error signal with said predicted input signal to develop an output signal;
   means for generating said predicted input signal based on previous said output signal; and
   means for supplying said output signal from said detector to said subsequent circuitry.

2. A detector as set forth in claim 1 wherein said continuous-wave-modulation is amplitude modulation, wherein said means for supplying a carrier signal includes a source of unmodulated carrier signal and wherein said means for modulating said carrier signal includes a first multiplier for multiplying said unmodulated carrier signal with said predicted input signal.

3. A detector as set forth in claim 2 where said means for decoding the error signal comprises:
   a synchronous detector synchronously detecting said third continuous-wave-modulation signal in accordance with said unmodulated carrier signal to generate a synchronous detection response; and
   means for supplying at least a fraction of said synchronous detection response to said means for combining as said decoded error signal.

4. A detector as set forth in claim 2 wherein said synchronous detector comprises:
   a second multiplier for multiplying said unmodulated carrier signal with said third continuous-wave-modulation signal to generate said synchronous detection response as their product.

5. A detector as set forth in claim 2 wherein said means for decoding the error signal comprises:
   a synchronous detector synchronously detecting a fraction of said third continuous-wave-modulation signal in accordance with said unmodulated carrier signal to generate said decoded error signal.

6. A detector as set forth in claim 5 wherein said synchronous detector comprises:
   a second multiplier for multiplying said unmodulated carrier signal with said fraction of said third continuous-wave-modulation signal to generate said synchronous detection response as their product.

7. A detector as set forth in claim 2 wherein said amplitude modulation has a suppressed carrier and said means for generating said predicted signal generates predicted signal equal to delayed output signal.

8. A detector as set forth in claim 2 wherein said means for generating said predicted signal generates predicted signal equal to delayed output signal as augmented by a constant.

9. A detector as set forth in claim 1 wherein said means for supplying a carrier signal is of a type that supplies first and second phases of unmodulated carrier signal in quadrature relationship with each other; wherein said means for modulating said carrier signal comprises a first multiplier for multiplying said first phase of unmodulated carrier signal with a first component portion of a predicted input signal to generate a first product signal, a second multiplier for multiplying said second phase of unmodulated carrier signal with a second component portion of a predicted input signal to generate a second product signal, and means for linearly combining said first and second product signals to generate said second continuous-wave-modulation signal, said first and second component portions of said predicted signal being mutually orthogonal; wherein said means for decoding the error signal comprises a first synchronous detector synchronously detecting at least a fraction of said third continuous-wave-modulation signal in accordance with said first phase of unmodulated carrier signal, thereby generating a first synchronous detection response, and a second synchronous detector synchronously detecting said at least a fraction of said third continuous-wave-modulation signal in accordance with said second phase of unmodulated carrier signal, thereby generating a second synchronous detection response; wherein said means for combining said decoded error signal with said predicted signal comprises means for combining at least a fraction of each of the first and second synchronous detection responses respectively with said first and said second component portions of said predicted input signal to develop first and second component portions respectively of said output signal; and wherein said means for generating said predicted input signal is of a type in which samples of the first and second component portions of said predicted input signal are formed from previous samples of the first and second component portions respectively of said output signal.

10. A detector as set forth in claim 9 where said first and second component portions of said predicted input signal are respectively real and imaginary portions thereof; wherein said first and second portions of said output signal are respectively real and imaginary portions thereof; and wherein said means for supplying a carrier signal comprises:
- a controlled oscillator having the frequency and phase of its output signals determined by a control signal;
- a third multiplier multiplying together the first and second portions of said output signal to generate a product signal; and
- means for low-pass filtering said product signal to generate said control signal.

11. A detector as set forth in claim 9 wherein said means for supplying a carrier signal comprises a beat-frequency oscillator and wherein means are included for vectorially adding the first and second portions of said output signal to generate to further output signal.

12. A detector as set forth in claim 9 for use with a first continuous-wave-modulation signal having a carrier component associated therewith, said detector including:
- means for combining said first and second portions of said output signal to generate a real portion of said output signal as multiplied by a factor; and
- means for combining said first and second portions of said output signal to generate a imaginary portion of said output signal as multiplied by a factor.

13. A detector as set forth in claim 12 wherein said means for supplying a carrier signal comprises:
- a controlled oscillator having the phase of its output signals determined by a control signal;
- means for differentially combining the first and second component portions of said output signal to generate a difference output signal; and
- means for low-pass filtering said difference output signal to generate said control signal.

14. A detector as set forth in claim 9 wherein said input signal includes in its real portion the entirety of an accompanying carrier signal; wherein said first and second component portions of said predicted input signal are respectively real and imaginary portions thereof; wherein said first and second portions of said output signal are respectively real and imaginary portions thereof; and wherein said means for supplying a carrier signal comprises:
- a controlled oscillator having the frequency a phase of its output signals determined by a control signal; and
- means for low-pass filtering the imaginary portion of said output signal to generate said control signal.

15. An analog adaptive synchronous demodulator for double sideband suppressed carrier amplitude modulated signals comprising:
- first multiplier means connected to receive a carrier signal and a detected output signal for generating a first product signal;
- subtractor means connected to receive a modulated suppressed carrier signal, said subtractor means being coupled to the output of said first multiplier means for subtracting said first product signal from said modulated suppressed carrier signal;
- second multiplier means connected to receive said carrier signal, said second multiplier means being coupled to the output of said subtractor means for generating a second product signal; and
- integrator means coupled to the output of said second multiplier means for generating said detector output signal, said detected output signal being fed back to said first multiplier means.

16. The demodulator according to claim 15 wherein said first and second multiplier means each comprises a four-quadrant analog multiplier, said subtractor means comprises a summing amplifier and said integrator means comprises an analog integrator.

17. The demodulator according to claim 16 wherein the gain of said first multiplier is equal to the ratio $$\left(\frac{R_1 + R_3}{R_2 + R_3}\right),$$

where
- $R_1$ represents the value of resistance coupling the output of said first multiplier means to an input of said subtractor means;
- $R_1$ represents the value of resistance coupling the output of said first multiplier means to an input of said subtractor means;
- $R_2$ represents the value of resistance in the path taken to said subtractor means by said modulated suppressed carrier signal; and
- $R_3$ represents the value of resistance coupling said input of said subtractor means to a common ground.

18. The demodulator according to claim 16 wherein said subtractor means includes two inputs, one of said inputs being connected to receive said modulated suppressed carrier signal, the other of said inputs being coupled to the output of said first multiplier means and having biased at a predetermined voltage level above a common ground, and resistive means coupling the output of said subtractor means to said one of said inputs.

19. The demodulator according to claim 18 wherein said other of said inputs is biased at a predetermined voltage level above ground by a resistance coupled therebetween, the value of said resistance being equal to the value of said resistive means.

20. A technique for synchronous demodulation of double sideband suppressed carrier signals using an adaptive analog demodulation method, comprising the steps of:
- generating a first product signal by multiplying a carrier signal with a detected output signal;
- generating a difference signal by subtracting said first product signal from a demodulated suppressed carrier signal;
- generating a second product signal by multiplying said difference signal with said carrier signal; and
- integrating said second product signal to produce said detected output signal.

21. The technique of claim 20 including the step of filtering even harmonics of said modulated suppressed carrier signal.

22. A detector for amplitude-modulation signals, said detector comprising:
- means for supplying a first amplitude-modulation signal, which encodes an input signal;
- means for supplying an unmodulated carrier signal;
- means for amplitude-modulating said unmodulated carrier signal in accordance with a predicted input signal, thereby to generate a second amplitude-modulation signal;

means for comparing the instantaneous amplitudes of said first and second amplitude-modulation signals to develop a suppressed-carrier third amplitude-modulation signal, which encodes an error signal;

means for synchronously demodulating said third amplitude-modulation signal with said unmodulated carrier signal for decoding said error signal;

means for combining said error signal with said predicted input signal to develop an output signal; and means for generating said predicted input signal based on a previous value of said output signal.

23. A detector for amplitude-modulation signals as set forth in claim 22 wherein said first and second amplitude-modulation signals are at least partially suppressed-carrier in nature.

24. A detector for amplitude-modulation signals as set forth in claim 23 wherein said first and second amplitude-modulation signals have substantially completely suppressed carriers.

25. A detector for amplitude-modulation signals as set forth in claim 24 wherein said means for amplitude-modulating said unmodulated carrier comprises a first multiplier receptive of said predicted input signal and said unmodulated carrier signal, one as multiplier and the other as multiplicand, for generating said second amplitude-modulation signal as a product of said multiplier and multiplicand.

26. A detector for amplitude-modulation signals as set forth in claim 23 wherein said means for comparing said first and second amplitude-modulation signals comprises means for combining said first and second amplitude-modulation signals to develop said suppressed-carrier third amplitude-modulation signal.

27. A detector for amplitude-modulation signals as set forth in claim 26 wherein said means for decoding said error signal comprises a second multiplier receptive of said unmodulated carrier signal and said third amplitude-modulation signal, one as multiplier and the other as multiplicand, for generating said error signal as a product of said multiplier and multiplicand.

28. A detector for amplitude-modulation signals as set forth in claim 27 wherein said means for combining said error signal with said predicted input signal comprises an adder receiving said error signal and said predicted input signal as addends and summing said addends to develop said output signal.

29. A detector for amplitude-modulation signals as set forth in claim 28 wherein said means for generating said predicted input signal comprises a one sample period delay of said output signal.

30. A detector for amplitude-modulation signals as set forth in claim 23 wherein said first and second amplitude-modulation signals each have substantial carrier component.

31. A detector for amplitude-modulation signals as set forth in claim 30 wherein said means for amplitude-modulating said unmodulated carrier includes:
a first adder for adding a pedestal value to said predicted input signal to generate a first sum signal; and
a first multiplier receptive of said first sum signal and said unmodulated carrier signal, one as multiplier and the other as multiplicand, for generating said second amplitude-modulation signal as a product of said multiplier and multiplicand.

32. A detector for amplitude-modulation signals as set forth in claim 31 wherein said means for comparing said first and second amplitude-modulation signals comprises means for combining said first and second amplitude-modulation signals to develop said suppressed-carrier third amplitude-modulation signal.

33. A detector for amplitude-modulation signals as set forth in claim 32 wherein said means for decoding said error signal comprises a second multiplier receptive of said unmodulated carrier signal and said third amplitude-modulation signal, one as a multiplier and the other as multiplicand, for generating said error signal as a product of said multiplier and multiplicand.

34. A detector for amplitude-modulation signals as set forth in claim 33 wherein said means for combining said error signal with said predicted input signal comprises a second adder receiving said error signal and said predicted input signal as addends and summing said addends to develop said output signal.

35. A detector for amplitude-modulation signals as set forth in claim 34 wherein said means for generating said predicted input signal comprises a one sample period delay of said output signal.

36. A detector for amplitude-modulation signals, said detector comprising:
means for supplying a first amplitude-modulation signal, which encodes an input signal;
means for supplying an unmodulated carrier signal;
means for amplitude-modulating said unmodulated carrier signal in response to an output signal, thereby to generate a second amplitude-modulation signal;
means for comparing the instantaneous amplitudes of said first and second amplitude-modulation signals to develop a suppressed-carrier third amplitude-modulation signal, which encodes an error signal;
means synchronously demodulating said third amplitude-modulation signal with said unmodulated carrier signal for decoding said error signal;
means for combining said error signal with a predicted input signal to develop said output signal; and
means for generating said predicted input signal by delaying said output signal.

37. A detector for amplitude-modulation signals as set forth in claim 36 wherein said first and second amplitude-modulation signals are at least partially suppressed-carrier in nature.

38. A detector for amplitude-modulation signals as set forth in claim 37 wherein said first and second amplitude-modulation signals have substantially completely suppressed carriers.

39. A detector for amplitude-modulation signals as set forth in claim 38 wherein said means for amplitude-modulating said unmodulated carrier comprises a first multiplier receptive of said output signal and said unmodulated carrier signal, one as multiplier and the other as multiplicand, for generating said second amplitude-modulation signal as a delayed product of said multiplier and multiplicand.

40. A detector for amplitude-modulation signals as set forth in claim 39 wherein said means for comparing said first and second amplitude-modulation signals comprises means for combining said first and second amplitude-modulation signals to develop said suppressed-carrier third amplitude-modulation signal.

41. A detector for amplitude-modulation signals as set forth in claim 40 wherein said means for decoding said error signal comprises a second multiplier receptive of delayed said unmodulated carrier signal and said third amplitude-modulation signal, one as multiplier and the other as multiplicand, for generating said error signal as a product of said multiplier and multiplicand.

42. A detector for amplitude-modulation signals as set forth in claim 41 wherein said means for combining said error signal with said predicted input signal comprises an adder receiving said error signal and said predicted input signal as addends and summing said addend to develop said output signal.

43. A detector for amplitude-modulation signals as set forth in claim 36 wherein said first and second amplitude-modulation signals both have substantial carrier components.

44. A detector for amplitude-modulation signals as set forth in claim 43 wherein said means for amplitude-modulating said unmodulated carrier includes:
    a first adder for adding a pedestal value to said output signal to generate a first sum signal; and
    a first multiplier receptive of said first sum signal and of said unmodulated carrier signal, one as multiplier and the other as multiplicand, for generating said second amplitude-modulation signal as a delayed product of said multiplier and multiplicand.

45. A detector for amplitude-modulation signals as set forth in claim 44 wherein said means for comparing said first and second amplitude-modulation signals comprises means for combining said first and second amplitude-modulations signals.

46. A detector for amplitude-modulation signals as set forth in claim 45 wherein said means for decoding said error signal consists of a second multiplier receptive of said third amplitude-modulation signal and of delayed said unmodulated carrier signal, one as multiplier and the other as multiplicand, for generating said error signal as a product of said multiplier and multiplicand.

47. A detector for amplitude-modulation signals as set forth in claim 46 wherein said means for combining said error signal with said predicted input signal comprises a second adder receiving said error signal and said predicted input signal as addends and summing said addends to develop said output signal.

48. A detector for incoming amplitude-modulation signals encoding an input signal, said detector including:
    a first input connection for receiving said amplitude-modulation signal encoding an input signal;
    a second input connection for receiving an unmodulated carrier signal; and
    an output connection for delivering an output signal, and being characterized by:
    an amplitude-modulator for modulating the unmodulated carrier signal in response to the output signal, thereby to provide a further amplitude-modulation signal;
    a linear combiner combining the incoming amplitude-modulation signal and the further amplitude-modulation signal to generate a suppressed-carrier amplitude-modulation signal encoding an error signal;
    a synchronous demodulator for decoding the error signal from the suppressed-carrier amplitude modulation signal with prescribed weight;
    a delay line providing a delayed response to the output signal; and
    an adder summing together the delayed response and the error signal with prescribed weight to generate the current value of the output signal applied to said output connection.

49. A detector as set forth in claim 48 being characterized by said amplitude modulator modulating the unmodulated carrier signal in response to the output signal as delayed by said delay line.

50. A detector as set forth in claim 48 being characterized by said amplitude modulator modulating the unmodulated carrier signal in response to the output signal as applied thereto without appreciable delay from said output connection.

* * * * *